United States Patent
Taguchi

(10) Patent No.: US 10,850,334 B2
(45) Date of Patent: Dec. 1, 2020

(54) MOLD FOR RESIN SEALING A SEMICONDUCTOR CHIP, AND SEMICONDUCTOR DEVICE HAVING RESIN-SEALED SEMICONDUCTOR CHIP

(71) Applicant: SEIKO INSTRUMENTS INC., Chiba (JP)

(72) Inventor: Yasuhiro Taguchi, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 14/946,903

(22) Filed: Nov. 20, 2015

(65) Prior Publication Data
US 2016/0172316 A1 Jun. 16, 2016

(30) Foreign Application Priority Data

Dec. 10, 2014 (JP) .................................. 2014-250011

(51) Int. Cl.
*H01L 23/495* (2006.01)
*H01L 23/28* (2006.01)
(Continued)

(52) U.S. Cl.
CPC .............. *B23C 3/00* (2013.01); *H01L 21/565* (2013.01); *H01L 23/49541* (2013.01);
(Continued)

(58) Field of Classification Search
CPC ............. H01L 21/565; H01L 23/49541; H01L 23/49548; H01L 2224/0404; H01L 2224/48247; H01L 2224/73265; H01L 2924/1815; H01L 2224/32245; H01L 23/48; H01L 23/495; H01L 23/498; H01L 33/62; H01L 21/56; H01L 23/28; H01L 31/0203; H01L 31/048; H01L 33/52
(Continued)

(56) References Cited

U.S. PATENT DOCUMENTS 6,924,514 B2 * 8/2005 Suenaga ................ H01L 33/486
257/100
7,855,395 B2 * 12/2010 Lee ........................ H01L 33/52
257/100
(Continued)

FOREIGN PATENT DOCUMENTS

JP      10 154768      9/1998
JP      2006 027074    2/2006
(Continued)

OTHER PUBLICATIONS

Abstract, Publication No. 2000-102929, Publication Date Apr. 11, 2000.

*Primary Examiner* — Jami Valentine Miller
*Assistant Examiner* — Dilinh P Nguyen
(74) *Attorney, Agent, or Firm* — Adams & Wilks

(57) ABSTRACT

A mold is configured to resin-seal a semiconductor chip to form a semiconductor package. The mold has a first mold cavity and a second mold cavity formed in the bottom of the first mold cavity with a stepped portion between the two mold cavities. The two mold cavities are formed in succession by a high-speed rotary cutter having a downwardly tapered round cutting surface that imparts a corresponding taper to walls of the two mold cavities.

2 Claims, 5 Drawing Sheets

(51) Int. Cl.
*H01L 23/29* (2006.01)
*B23C 3/00* (2006.01)
*H01L 21/56* (2006.01)

(52) U.S. Cl.
CPC ...... *B23C 2220/44* (2013.01); *B23C 2220/64* (2013.01); *H01L 23/49548* (2013.01); *H01L 2224/04042* (2013.01); *H01L 2224/32245* (2013.01); *H01L 2224/48247* (2013.01); *H01L 2224/73265* (2013.01); *H01L 2924/1815* (2013.01)

(58) Field of Classification Search
USPC .......................................... 257/666, 787, 790
See application file for complete search history.

(56) References Cited

U.S. PATENT DOCUMENTS

| | | | | |
|---|---|---|---|---|
| 7,868,471 B2* | 1/2011 | Camacho | ............ | H01L 23/3135 |
| | | | | 257/678 |
| 2002/0105072 A1 | 8/2002 | Huang | .......................... | 257/730 |
| 2011/0180832 A1* | 7/2011 | Kim | ...................... | H01L 33/486 |
| | | | | 257/98 |
| 2012/0061880 A1* | 3/2012 | Han | .................... | B29C 45/0046 |
| | | | | 264/443 |
| 2013/0003375 A1* | 1/2013 | Hussell | ................. | H01L 33/486 |
| | | | | 362/249.02 |
| 2015/0107353 A1* | 4/2015 | Kono | .................... | H01L 21/565 |
| | | | | 73/204.26 |

FOREIGN PATENT DOCUMENTS

| JP | 2010 199412 | 9/2010 |
|---|---|---|
| JP | WO 2013/154144 | * 10/2013 |

* cited by examiner

MOLD FOR RESIN SEALING A SEMICONDUCTOR CHIP, AND SEMICONDUCTOR DEVICE HAVING RESIN-SEALED SEMICONDUCTOR CHIP

BACKGROUND OF THE INVENTION

1. Field of the Invention

The present invention relates to a mold for resin sealing, a manufacturing method therefor, a package manufactured by using the mold, and a semiconductor device using the package.

2. Description of the Related Art

Along with downsizing of portable electronic devices in recent years, semiconductor packages that are downsized and reduced in thickness are required to be used therefor. The semiconductor package needs to seal a semiconductor chip mounted therein with a resin so as to protect the semiconductor chip from an environmental atmosphere. For downsizing and thickness reduction of the semiconductor packages, molds for resin sealing of a semiconductor package are also required to be microfabricated and reduced in thickness. Further, in order to reduce manufacturing costs of the semiconductor package, a high-density layout is required for a lead frame used in manufacture of the semiconductor package. A microfabricated mold with high accuracy is required as a mold for resin sealing of a lead frame laid out at a high density.

Even when the semiconductor package is downsized and reduced in thickness, performance as a semiconductor is required to be enhanced. Accordingly, the semiconductor package is required to be able to mount a semiconductor chip as large as possible therein.

In order to enable the semiconductor package to mount the semiconductor chip as large as possible therein, each of corner portions of a sealing resin is generally formed to have a right-angled shape.

In order to form a cavity shape of the mold for resin sealing for the formation of the semiconductor package, there is generally used a method of processing the cavity of the mold by electrical discharge machining using an electrode for die-sinking electrical discharge machining in a die-sinking electrical discharge machine. The die-sinking electrical discharge machining inevitably requires the electrode for die-sinking electrical discharge machining. The electrode for die-sinking electrical discharge machining is placed in the die-sinking electrical discharge machine to intermittently perform arc discharge on a surface of a mold material in an insulating working fluid such as kerosene to form the cavity shape of the mold. The die-sinking electrical discharge machining is performed in a plurality of steps including rough machining, intermediate machining, and finish machining. Accordingly, electrodes for machining for the rough machining, the intermediate machining, and the finish machining are required to be manufactured respectively. Further, additional machining is performed in some cases so as to adjust a machining accuracy and a surface roughness. Further, a time period is required for not only the die-sinking electrical discharge machining in the die-sinking electrical discharge machine but also manufacturing of the additional electrodes for die-sinking electrical discharge machining, which increases a time period required for mold processing. As a result, manufacturing costs are increased.

Further, the die-sinking electrical discharge machining is performed in the plurality of steps including the rough machining, the intermediate machining, and the finish machining. Then a position of the electrode for die-sinking electrical discharge machining is sometimes corrected after the mold material under current machining is removed from the machine and is measured in case of replacement of the electrode for die-sinking electrical discharge machining or the processing for the cavities of the mold requiring high accuracy. Thus, the processing time for the cavities of the mold is further increased. As a result, costs for the processing for the cavities of the mold are further increased.

Further, in order to manufacture the semiconductor package inexpensively, a lead frame that is laid out at a high density is required in recent years. In the processing for the cavities of the mold for resin sealing used for the lead frame that is laid out at a high density, a distance between the cavities of the mold may be reduced to fail the manufacture of the electrode for die-sinking electrical discharge machining due to insufficient strength. Thus, the electrode for die-sinking electrical discharge machining for the cavities of the mold for resin sealing is required to be processed separately in a plurality of steps. As a result, the time period required for the processing for the cavities of the mold is further increased. Correspondingly, the mold becomes expensive.

In order to reduce the time period required for the die-sinking electrical discharge machining using the electrode for die-sinking electrical discharge machining in the die-sinking electrical discharge machine, the following processing has been proposed for the processing for the cavities of the mold for the semiconductor package. Specifically, cutting work is used as a part of the processing for the cavities of the mold, and finish processing is performed with the die-sinking electrical discharge machine (see, for example, Japanese Patent Application Laid-open No. 2000-102929).

When the cutting work is performed as a part of the processing and the die-sinking electrical discharge machining is performed as final finishing, however, the cutting work and the die-sinking electrical discharge machining cannot be performed in the same machine. Further, the electrode for die-sinking electrical discharge machining, which is used in the die-sinking electrical discharge machine, is required to be manufactured, and hence the time period required for the mold processing is not reduced as expected. Further, in the processing for the cavities of the mold using the electrode for die-sinking electrical discharge machining in the die-sinking electrical discharge machine, a satin-finished surface is formed on a processed surface. When the lead frame is removed from the mold after the processing with the mold for resin sealing of a semiconductor package, there is a fear in that the satin-finished surface becomes an anchor to cause a resin crack due to mold-release failure.

SUMMARY OF THE INVENTION

The present invention has an object to provide a method of forming a cavity of a mold, which is capable of reducing a time period required for processing for cavities of the mold without forming an anchor shape such as a satin-finished surface that may be formed on a cavity processed surface of the mold in die-sinking electrical discharge machining.

In order to achieve the above-mentioned object, the present invention uses the following measures.

First, there is provided a mold for resin sealing of a semiconductor chip, including: a first cavity formed through a surface of the mold; a second cavity formed through an inner bottom surface of the first cavity so as to overlap the first cavity; and a level-difference portion formed around an upper surface of the second cavity, each of the first cavity and the second cavity having corner portions formed at four corners thereof, each of the corner portions having a predetermined curvature radius.

Further, there is provided a method of manufacturing a mold for resin sealing of a semiconductor chip, including: preparing a mold material; performing high-speed rotary cutting on the mold material with a first round cutter to form a first cavity and to form corner portions, each having a first curvature radius, at four corners of the first cavity; and performing the high-speed rotary cutting on an inner bottom surface of the first cavity with a second round cutter to form a second cavity and to form corner portions, each having a second curvature radius, at four corners of the second cavity.

Further, there is provided a semiconductor device, which is formed by resin-sealing a semiconductor chip in a semiconductor package, the semiconductor device including: the semiconductor chip placed on an island; leads provided in vicinity of a periphery of the island; wires configured to electrically connect electrodes of the semiconductor chip and the leads to each other; and a sealing body configured to resin-seal the semiconductor chip, the island, the leads, and the wires, in which the sealing body has a laminate structure of a first sealing body and a second sealing body.

The processing for the cavities in mold manufacture through the high-speed rotary cutting using the round cutter according to the present invention is performed through the cutting work using the round cutter. Accordingly, an electrode for die-sinking electrical discharge machining needed in a die-sinking electrical discharge machine is not required. As a result, the processing time for the cavities of the mold is reduced to greatly reduce processing costs.

Further, since the processing is not carried out separately even in the processing for the cavities in the mold manufacture for a lead frame laid out at a high density, the mold can be manufactured with high accuracy.

Further, the mold can be manufactured without occurrence of a resin crack at the time of release from the mold after resin-sealing due to undercut caused by a satin-finished surface on a cavity processed surface of the mold, which is generated when the die-sinking electrical discharge machining is used.

DETAILED DESCRIPTION OF THE EMBODIMENT

Now, the present invention is described referring to the accommodating drawings.

Figure 1:
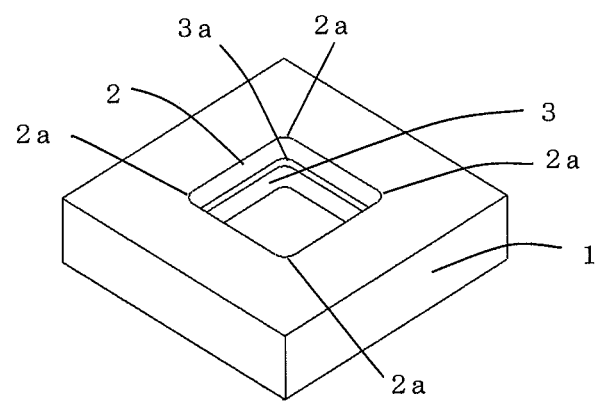
FIG. 1 is a perspective view of a mold for resin sealing of a semiconductor package according to the present invention.

FIG. 1 is a perspective view of a mold for resin sealing of a semiconductor package according to the present invention. FIG. 1 is an enlarged view for one semiconductor chip.

In a mold 1, a first mold cavity 2 and a second mold cavity 3 that form a resin sealing shape for the semiconductor package are formed. Corner portions 2a are formed at four corners of the first cavity 2, and corner portions 3a are formed at four corners of the second cavity 3. Each of the corner portions 2a and the corner portions 3a has a curvature radius equal to or larger than a cutter radius of a round cutter. An inner side surface of each of the first cavity 2 and the second cavity 3 is tapered.

Figure 2:
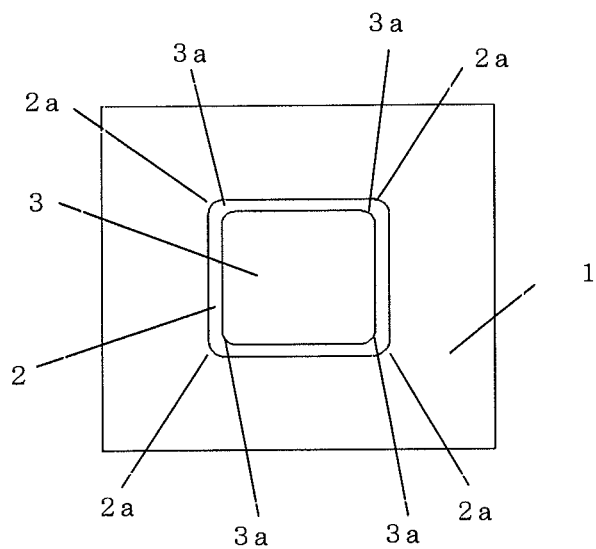
FIG. 2 is a plan view of the mold for resin sealing of a semiconductor package according to the present invention.

FIG. 2 is a plan view of FIG. 1 as viewed from the cavity side. The first cavity 2 is formed larger than the second cavity 3. In plan view, the second cavity 3 is formed inside of the first cavity 2 so as to overlap the first cavity 2. The corner portions 2a, each being rounded, are formed at the four corners of the first cavity 2, whereas the corner portions 3a similar to the corner portions 2a, each being rounded, are also formed at the four corners of the second cavity 3.

Figure 3:
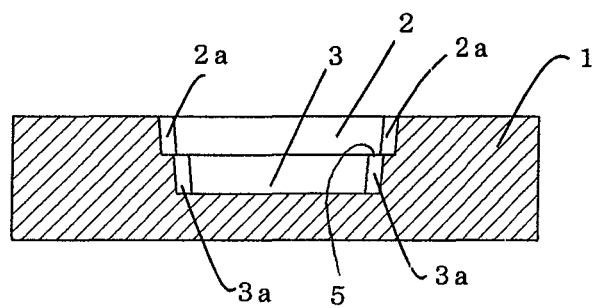
FIG. 3 is a sectional view of the mold for resin sealing of a semiconductor package according to the present invention.

FIG. 3 is a sectional view cut along a line connecting the diagonally opposed corner portions of the rectangular cavities illustrated in FIG. 2. The first cavity 2 is formed as an opening from a surface of the mold 1 to a certain depth. Below the first cavity 2, the second cavity 3 is formed as an opening in the bottom surface of the first cavity 2. In FIG. 3, a level-difference portion in the form of a step 5 is formed on a peripheral bottom surface of the first cavity 2. A width of the lower surface of the opening of the first cavity 2 is larger than a width of an upper surface of the opening of the second cavity 3. Although depths of the first cavity 2 and the second cavity 3 are the same, a ratio of the depth of the first cavity 2 and the depth of the second cavity 3 may be changed.

Figure 4:
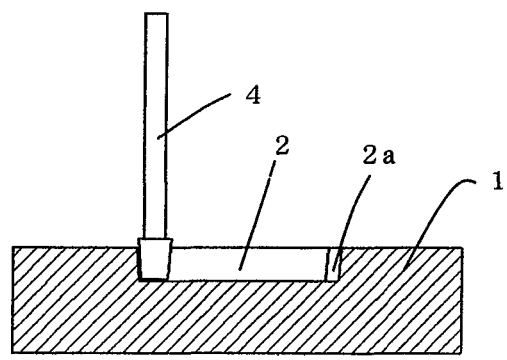
FIG. 4 is a sectional view for illustrating processing for cavities of the mold according to the present invention.

FIG. 4 is a sectional view for illustrating processing for the first cavity according to the present invention. The first cavity 2 is formed as the opening in a prepared material for mold 1 through high-speed rotary cutting using a round cutter 4, for example, an end mill. A depth of the opening is desirably within a range from a depth equal to a cutter diameter of the round cutter 4 to twice of the cutter diameter. Cutting side surfaces of the round cutter are tapered. The taper is transferred to the material for mold 1 that is an object to be cut, thereby forming the first cavity 2 having tapered side surfaces that taper inwardly in the downward direction in FIG. 4. Each of the corner portions 2a formed at the four corners of the first cavity 2 has a predetermined curvature radius. The predetermined curvature radius is equal to or larger than a cutter radius of the round cutter. The cutter radius and the cutter diameter are a radius and a diameter in cross section of the tapered round cutter when the round cutter is longitudinally cut into half.

Figure 5:
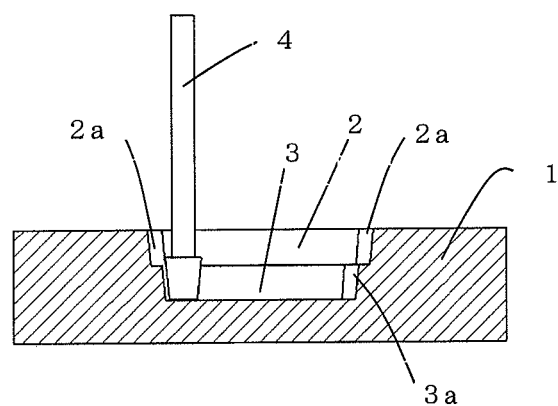
FIG. 5 is a sectional view subsequent to FIG. 4, for illustrating processing for the cavities of the mold according to the present invention.

FIG. 5 is a sectional view for illustrating processing for the second cavity subsequent to the processing for the first cavity according to the present invention. The round cutter 4 is brought into contact with a bottom surface on an inner side with respect to the first cavity 2 to cut deeply the material for mold 1, thereby forming the second cavity 3. The round cutter 4 used in the processing for the second cavity 3 may be the same as that used for the preceding processing for the first cavity or may also be different. The cutting side surfaces of the round cutter are tapered. The taper is transferred to the material for mold 1 that is the object to be cut, thereby forming the second cavity 3 having tapered side surfaces that taper inwardly in the downward direction in FIG. 5. Each of the corner portions 3a formed at the four corners of the second cavity 3 has a predetermined curvature radius. The predetermined curvature radius is equal to or larger than a cutter radius of the round cutter.

Through the two-level cutting work described above, the cavities are formed in a multi-level fashion. The number of levels formed by the cavities is not limited to two. A multi-level cavity including three to n cavities may be formed as needed.

Figure 6:
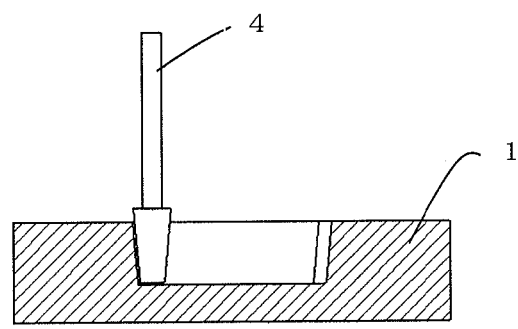
FIG. 6 is a sectional view for illustrating processing for a cavity of a mold according to a comparative example.

As a comparative example, FIG. 6 is a sectional view of an example where the high-speed cutting using the round cutter is, carried out in one level. When a processing depth becomes twice or larger than the cutter diameter of the round cutter 4, there is a possibility in that a cutting load of the material for mold 1 is applied to the round cutter rotating at a high speed during cutting work to damage the round cutter. A plurality of cavities of the mold for resin sealing of a semiconductor package are processed based on a layout of a lead frame. Some molds have a large number of cavities of 1,000 or larger. When the round cutter 4 is damaged during the processing for the plurality of cavities of the mold, there is a fear of scratching the mold. When the cutter radius is increased so as to avoid damage to the round cutter, the curvature radius of each of the corner portions at the four corners becomes significantly large. As a result, there arises a problem in that a size of the semiconductor package after being sealed with a resin becomes significantly large with respect to a size of a semiconductor chip.

In the high-speed rotary cutting with the round cutter according to the present invention, once a mold material is placed in a processing machine for cavities of a mold, for example, an NC milling machine, a workpiece is not required to be removed therefrom until the end of processing although replacement of the round cutter is required due to wear of the round cutter. Further, since an auto-tool changer (ATC) is mounted in a machine tool such as the NC milling machine for the replacement of the round cutter, manual replacement work is not required. Only by setting the mold material and the cutter in the machine, the cavities of the mold can be processed with a machining accuracy of a processing machine such as the NC milling machine, that is, a finish at, for example, ±0.0002 mm (±0.2 μm) and with higher accuracy within a shorter period of time as compared with die-sinking electrical discharge machining using an electrode for die-sinking electrical discharge machining in a die-sinking electrical discharge machine.

In the high-speed rotary cutting with the round cutter, processed surfaces of the mold are cut surface and are smooth without including a satin-finished surface as being formed in the die-sinking electrical discharge machining using the electrode for die-sinking electrical discharge machining in the die-sinking electrical discharge machine. Thus, a semiconductor package without effects of undercut due to a convex and concave shape such as the satin-finished surface at the time of release from the forming mold after being sealed with the resin and without a fear of occurrence of a resin crack can be molded.

Figure 7:
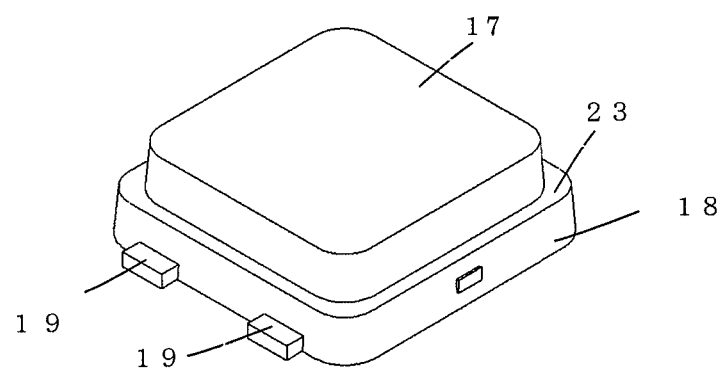
FIG. 7 is a perspective view of a semiconductor package resin-sealed by using the mold according to the present invention.
Figure 8:
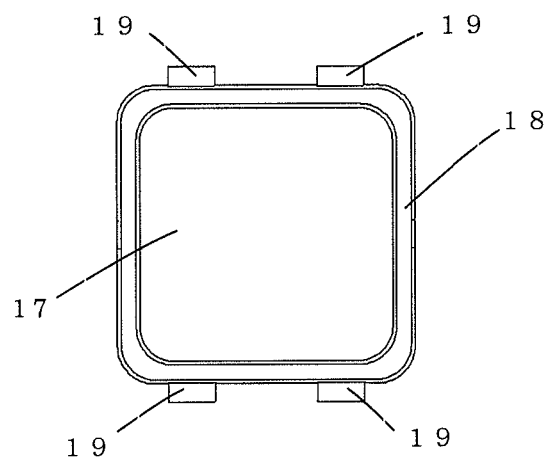
FIG. 8 is a plan view of the semiconductor package resin-sealed by using the mold according to the present invention.
Figure 9:
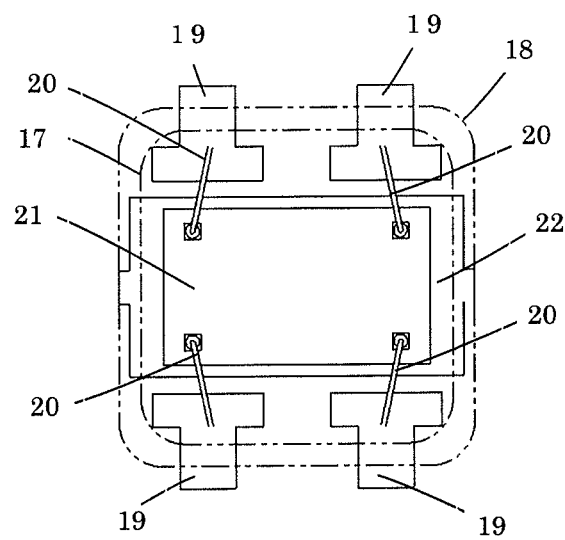
FIG. 9 is a perspective plan view of the semiconductor package resin-sealed by using the mold according to the present invention.
Figure 10:
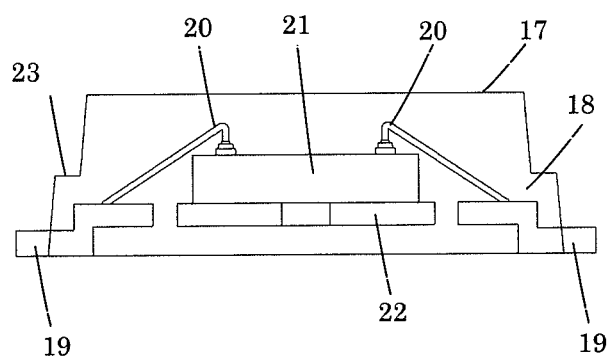
FIG. 10 is a perspective sectional view of the semiconductor package resin-sealed by using the mold according to the present invention.

FIG. 7 is a perspective view of a semiconductor device obtained by resin sealing in the semiconductor package manufactured by using the mold according to the present invention, and FIG. 8 is a plan view thereof. A sealing resin (molded resin body) has a shape corresponding to a shape of the mold. Specifically, a second sealing body portion 17 is laminated or stacked vertically on a first sealing body portion 18. The sectional area of the second sealing body 17 is smaller than the sectional area of the first sealing body 18. In the orientation shown in FIG. 7, the second sealing body portion 17 is an upper portion of the molded resin body and whose outer peripheral surface has a shape corresponding to that of the second mold cavity 3, and the first sealing body portion 18 is a lower portion of the molded resin body and whose outer peripheral surface has a shape corresponding to that of the first mold cavity 2. On an outer peripheral upper surface of the first sealing body 18, a resin level-difference surface 23 is formed. Outer leads 19 are exposed from side surfaces of the first sealing body 18. Corner portions at four corners of each of the first sealing body 18 and the second sealing body 17 have a rounded shape and has a characteristic of being unlikely to be cracked. FIG. 9 is a perspective plan view, and FIG. 10 is a perspective sectional view. On an island 22 of a lead frame, a semiconductor chip 21 is placed. In the vicinity of a periphery of the island 22, leads having the outer leads 19 are provided. Electrodes formed on a surface of the semiconductor chip 21 and the leads are electrically connected through wires 20. The above-mentioned elements are resin-sealed with the first sealing body 18 and the second sealing body 17. In this configuration, the island 22 and the leads of the lead frame are covered with the first sealing body 18, whereas the electrodes of the semiconductor chip 21 and the wires 20 for connecting the electrodes and the leads are covered with the second sealing body 17. Thus resin sealing properties are not affected thereby even when the second sealing body 17 is slightly smaller than the first sealing body 18.

Although the semiconductor package including the sealing bodies formed at two levels has been described above as an example, the present invention is not limited to the semiconductor package including the sealing bodies formed at two levels. The present invention is also applicable to a semiconductor package including sealing bodies formed at multiple levels as needed.

What is claimed is:

1. A mold for resin-sealing a semiconductor chip, the mold having a first mold cavity formed in an upper surface of the mold, and a second mold cavity formed in an inner bottom surface of the first mold cavity so as to overlap the first mold cavity in plan view, the inner bottom surface defining a step between the first and the second mold cavities, each of the first and the second mold cavities having four tapered corner portions separated by tapered side surfaces, and in plan view each of the four tapered corner portions having a first predetermined curvature radius at a top thereof and a second predetermined curvature radius at a bottom thereof.

2. A mold for resin-sealing a semiconductor chip according to claim 1; wherein the first predetermined curvature radius is larger than the second predetermined curvature radius.

* * * * *